(12) United States Patent
Nakayama et al.

(10) Patent No.: US 6,460,000 B1
(45) Date of Patent: Oct. 1, 2002

(54) MEASUREMENT DATA DISPLAY APPARATUS

(75) Inventors: Norio Nakayama, Atsugi; Takashi Oshimi, Isehara; Shigeo Hori; Masaaki Tamakoshi, both of Atsugi, all of (JP)

(73) Assignee: Anritsu Corporation, Tokyo (JP)

( * ) Notice: Subject to any disclaimer, the term of this patent is extended or adjusted under 35 U.S.C. 154(b) by 109 days.

(21) Appl. No.: 09/613,327

(22) Filed: Jul. 10, 2000

(30) Foreign Application Priority Data

Jul. 12, 1999 (JP) .......................................... 11-197658

(51) Int. Cl.⁷ ............................................. G01R 13/02
(52) U.S. Cl. ........................... 702/68; 702/67; 345/156; 345/157
(58) Field of Search ............................. 702/57, 67, 68, 702/186; 345/156–157, 761, 764, 773, 841, 845, 581–582, 619; 708/142–146; 356/73.1

(56) References Cited

U.S. PATENT DOCUMENTS

| | | | | |
|---|---|---|---|---|
| 5,504,502 A | * | 4/1996 | Arita et al. ................... | 345/160 |
| 5,515,301 A | * | 5/1996 | Corby, Jr. et al. ........... | 345/419 |
| 5,592,606 A | * | 1/1997 | Myers ......................... | 345/853 |
| 5,801,953 A | * | 9/1998 | Thoma et al. ................ | 702/68 |
| 5,943,123 A | * | 8/1999 | Oshimi et al. ............... | 356/73.1 |

OTHER PUBLICATIONS

Generic Requirements GR–196–Core Issue 1, Sep. 1995, (Generic Requirements for Optical Time Domain Reflectometer (OTDR) Type Equipment, Bellcore (Bell Communications Research)), pp. B–1 to B–12.

* cited by examiner

Primary Examiner—Bryan Bui
(74) Attorney, Agent, or Firm—Frishauf, Holtz, Goodman & Chick, P.C.

(57) ABSTRACT

A measurement data display apparatus is provided which has an input section, a display, and a control section. The display displays a main screen showing fundamental measurement data of a measured object. In addition, responsive to an operation of a first key of the input section, the control section pops up on the main screen a secondary screen which simultaneously includes a plurality of large item menus relating to additional measurement data of the measured object, and a plurality of small item menus corresponding to each of the plurality of large item menus. Each of the plurality of small item menus are displayed at a position corresponding to each of a plurality of function keys of the input section, and the plurality of large item menus are enabled to be selected by operating a second key of the input section.

38 Claims, 7 Drawing Sheets

MEASUREMENT DATA DISPLAY APPARATUS

CROSS-REFERENCE TO RELATED APPLICATIONS

This application is based upon and claims the benefit of priority from the prior Japanese Patent Application No. 11-197658, filed Jul. 12, 1999, the entire contents of which are incorporated herein by reference.

BACKGROUND OF THE INVENTION

The present invention relates to a measurement data display apparatus, and in particular, to a measurement data display apparatus which is applicable to an optical pulse tester for carrying out various measurements such as a loss and fault point of a measured optical fiber by making an optical pulse incident upon a measured optical fiber from a light source, and by photo-electrically converting a reflection light (back scattering light, Fresnel reflection light) returning back from the measured optical fiber in accompanying with the incidence of the optical pulse, into a signal so as to display its signal waveform, that is, to various data measuring apparatuses such as an optical time domain reflectometer (hereinafter, referred to as OTDR).

An OTDR has been already known as an apparatus which carries out various measurements such as a loss and fault point of a measured optical fiber by making an optical pulse incident upon a measured optical fiber from a light source, and by photo-electrically converting a reflection light returning back from the measured optical fiber in accompanying with the incidence of the optical pulse, into a signal so as to display its signal waveform.

FIG. 5 is a block diagram schematically showing a construction of this type of OTDR.

As shown in FIG. 5, an OTDR 31 comprises a timing generating section 32, a light emitting section (light source) 33, a photo-coupler 34, a light receiving section 35, an amplifier section 36, an A/D converter section 37, an adder circuit section 38, a calculation (operation) control section 39, and a display section 40.

In the OTDR 31, an optical pulse is emitted from the light emitting section 33 driven by a signal from the timing generating section 32, and then, the optical pulse is incident upon a measured optical fiber W via the photo-coupler 34.

Then, in accompanying with the incidence of the optical pulse, a reflection light reflected and returning back from the measured optical fiber W is again received by the light receiving section 35 via the photo-coupler 34, and then, is amplified by the amplifier section 36 at a predetermined amplification factor, and thus, is guided to the A/D converter section 37.

The A/D converter section 37 samples an output from the amplifier section 36 at a predetermined sampling period, and thereafter, supplies each data thus sampled to the adder circuit section 38.

The adder circuit section 38 makes an addition of the sampled each data for a predetermined time, and then, averages each data.

The averaged each data is supplied to the calculation control section 39.

The calculation control section 39 carries out a calculation relative to various measurements on the basis of the averaged each data, and thus, the result is displayed as a waveform data and a numeric data on the display section 40.

By the way, FIG. 6 and FIG. 7 individually show a display screen when selecting various items of a measuring apparatus such as the above OTDR disclosed in U.S. Pat. No. 5,801,953.

In such an apparatus, when a selection key provided in an apparatus main body is pushed, a window 51 as shown in FIG. 6 pops up, and then, is displayed on a screen.

By operating a pointing device (arrow keys) 52 and a select key 53 provided on a display area apart from the window 51, when one of sub-menus 54 in the pop-up and displayed window 51 is selected, a window display is transferred from the window 51 to a lower hierarchy window 55 as shown in FIG. 7.

However, in the aforesaid conventional measuring apparatus, in the case where the window 55 as shown in FIG. 7 is displayed, it is impossible to confirm the contents (item contents of sub-menu 54) of the window 51 shown in FIG. 6 in the window 55.

For this reason, when opening the window shown in FIG. 7 in error, in order to return the window display back to the window 51 shown in FIG. 6, the following operation is inevitably required; more specifically, in a state that the window 55 shown in FIG. 7 is displayed, the pointing device 52 is operated so as to position a cursor 56 onto "CANCEL", and thereafter, the select key 53 must be pushed down. Therefore, the number of key operations increases by the aforesaid operations; as a result, there is a problem of lacking in an operability.

By the way, in recent years, the apparatus main body of the OTDR is miniaturized so as to be readily carried as a portable equipment.

In addition, in such an OTDR, a characteristic measurement such as a loss and fault point of a measured optical fiber is carried out as a basic measurement at a desired spot of fiber, and besides, an item for processing a data obtained by the basic measurement is arbitrarily selected, and then, various settings are carried out.

However, the setting by items other than the above basic measurement is different from the setting of the basic measurement, and is utilized as the necessity arises. For this reason, taking an operability into consideration, it is desired to select various items allocated apart from measuring items of the basic measurement.

BRIEF SUMMARY OF THE INVENTION

Therefore, an object of the present invention is to provide a measurement data display apparatus which can visibly recognize a menu capable of being selected at the identical hierarchy on one screen, and can reduce the number of hierarchies on a screen and the number of key operations so as to improve an operability.

In order to achieve the above object, according to one aspect of the present invention, there is provided a measurement data display apparatus which displays a measurement data of a measured object on a screen, comprising:

an input section provided on the front side of the measurement data display apparatus, and including at least a first key, a second key and a plurality of function keys;

a display section provided on the front side of the measurement data display apparatus, and displaying a main screen displaying a measurement data of the measured object on the screen; and a control section making a pop-up display of a secondary screen which has a plurality of large item menus for processing a measurement data of the measured object and a plurality of small item menus corresponding to each of the plurality of large item menus, on the main screen of the display section by operating the first key of the input section, displaying each of the plurality of small item menus on a position corresponding to each of the plurality of function keys of the input section, and selecting the plurality of large item menus is selectable by operating the second key of the input section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
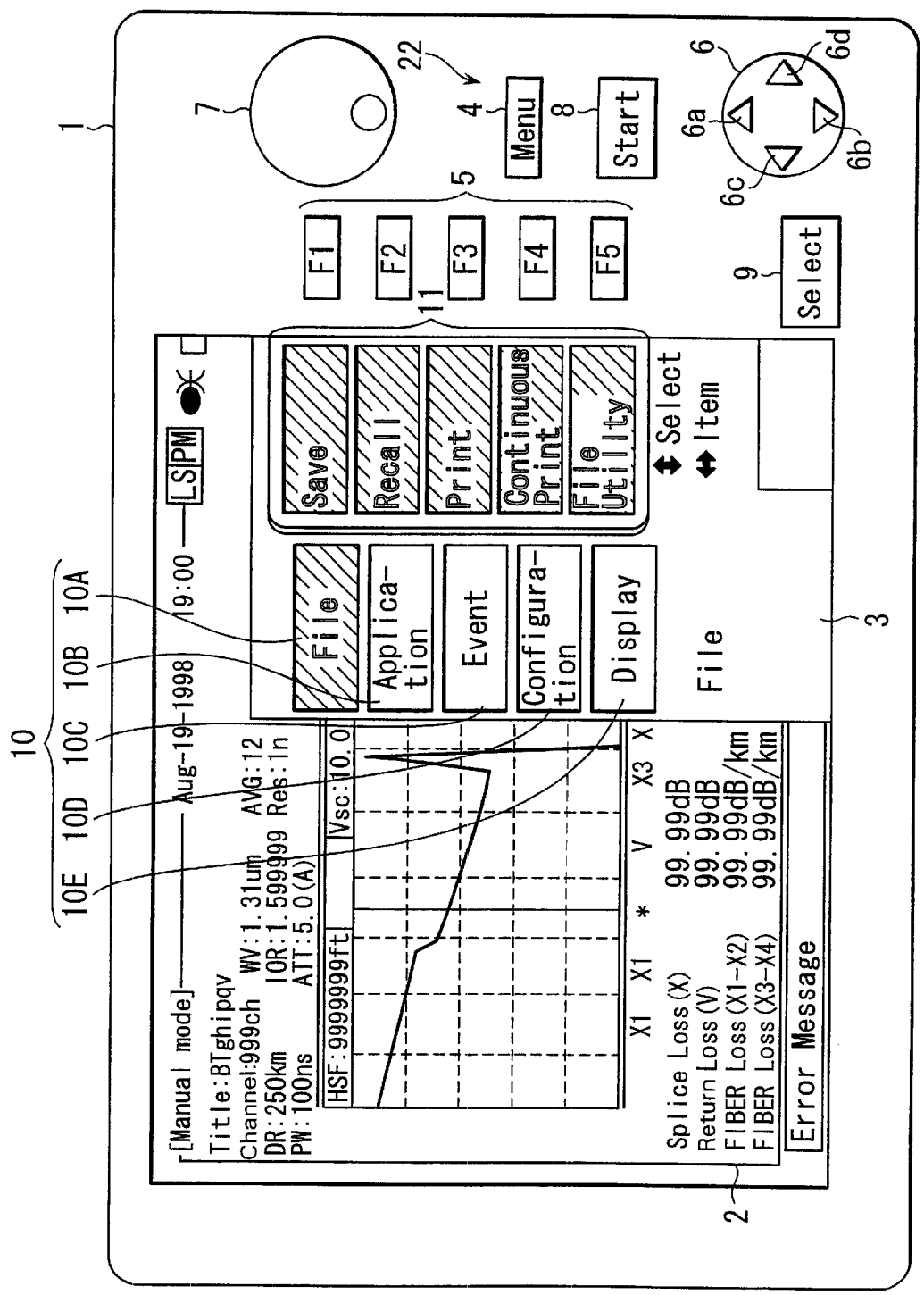
FIG. 1 is a front view showing an input section of an operator control panel, a secondary screen and a main screen in an OTDR which is applied to a measurement data display apparatus according to one embodiment of the present invention.

Reference will now be made in detail to the presently preferred embodiments of the invention as illustrated in the accompanying drawings, in which like reference numerals designate like or corresponding parts.

First, the following is a description on an outline of the present invention, that is, the case where a measurement data display apparatus according to the present invention is applied to an OTDR as one embodiment.

Namely, in order to achieve the above object, a first aspect has the following features; more specifically, an OTDR 31 makes an optical pulse incident upon a measured optical fiber W, and photo-electrically converts a reflection light returning back from the measured optical fiber in accompanying with the incidence of the optical pulse into a signal, and thereby, carries out a characteristic measurement such as a loss and fault point of the measured optical fiber at a desired spot of fiber as a fundamental measurement. Further, the OTDR 31 includes means for popping up and displaying a large item menu 10 and a small item menu 11 on a display screen as one secondary screen 3 by pushing down a key provided in an apparatus main body.

The large menu 10 has items for at least processing a data obtained by the fundamental measurement, and the small item menu 11 has items which are selectable for each large item menu and are arranged so as to correspond to a function key 5 provided on the apparatus main body.

A second aspect has the following features; more specifically, in the OTDR of the first invention, the OTDR distinguishes and displays a large item menu selected presently and a large item menu non-selected presently, and distinguishes and displays an executable small item menu of the large item menu, and a non-executable small item menu.

A third aspect has the following features; more specifically, in the OTDR of the first or second invention, the OTDR displays the small item menu in the form of plural lines so as to correspond to the function key 5 when the small item menu 11 is more than the function key 5. Further, the OTDR allocates a switching menu for switching a small item menu of plural lines selectable by the function key to function keys other than the function key corresponding to the small item menu, and then, displays it.

A fourth aspect has the following features; more specifically, in the OTDR of any of the first to third inventions, the large item menu 10 includes items relative to save, recall and print of waveform data, an item relative to a continuous measurement for continuously carrying out a comparison of waveform data and continuously carrying out the fundamental measurement and carrying out a comparison of waveform data, the fundamental measurement, and an item relative to an event comment and a land mark input in a waveform display screen.

Next, the embodiment of the present invention based on the aforesaid outline will be described below with reference to the accompanying drawings.

FIG. 1 is a front view showing a control panel of OTDR which is applied to a measurement data display apparatus according to one embodiment of the present invention.

Figure 5:
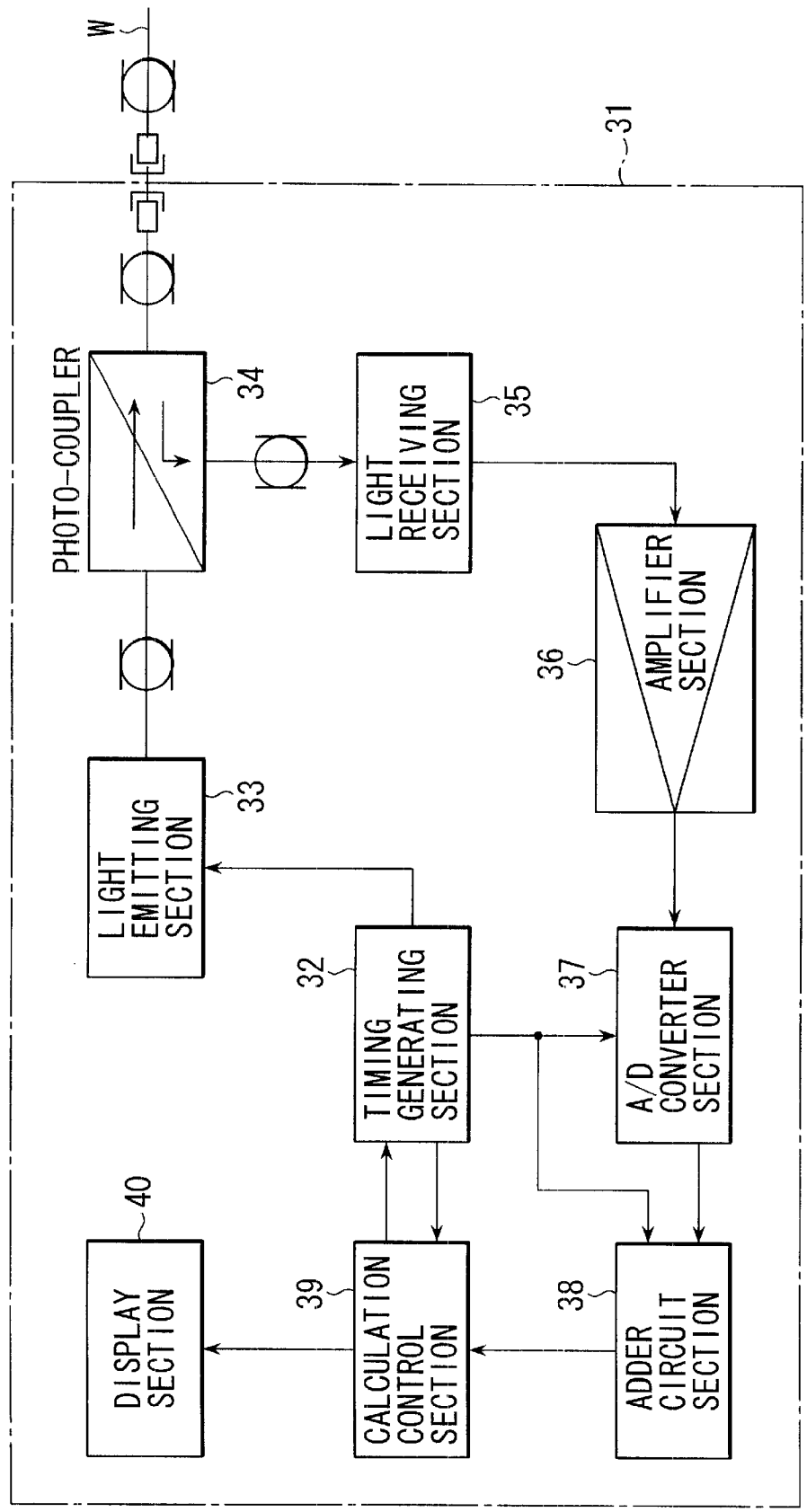
FIG. 5 is a block diagram schematically showing a construction of an OTDR which is applied as one embodiment of a measurement data display apparatus according to the present invention.
Figure 6:
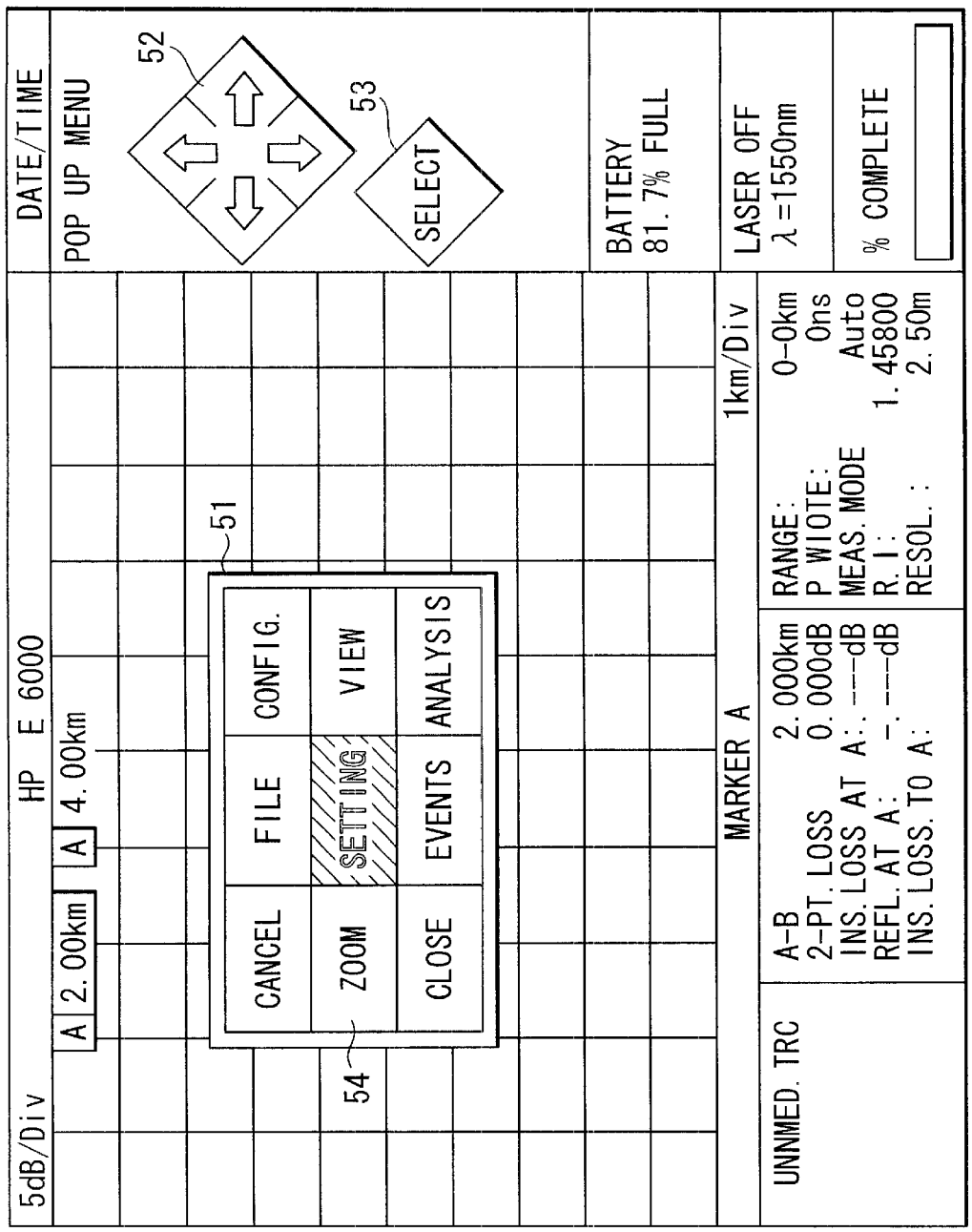
FIG. 6 is a view showing a display screen when selecting various items of a conventional measuring apparatus disclosed in U.S. Pat. No. 5,801,943.
Figure 7:
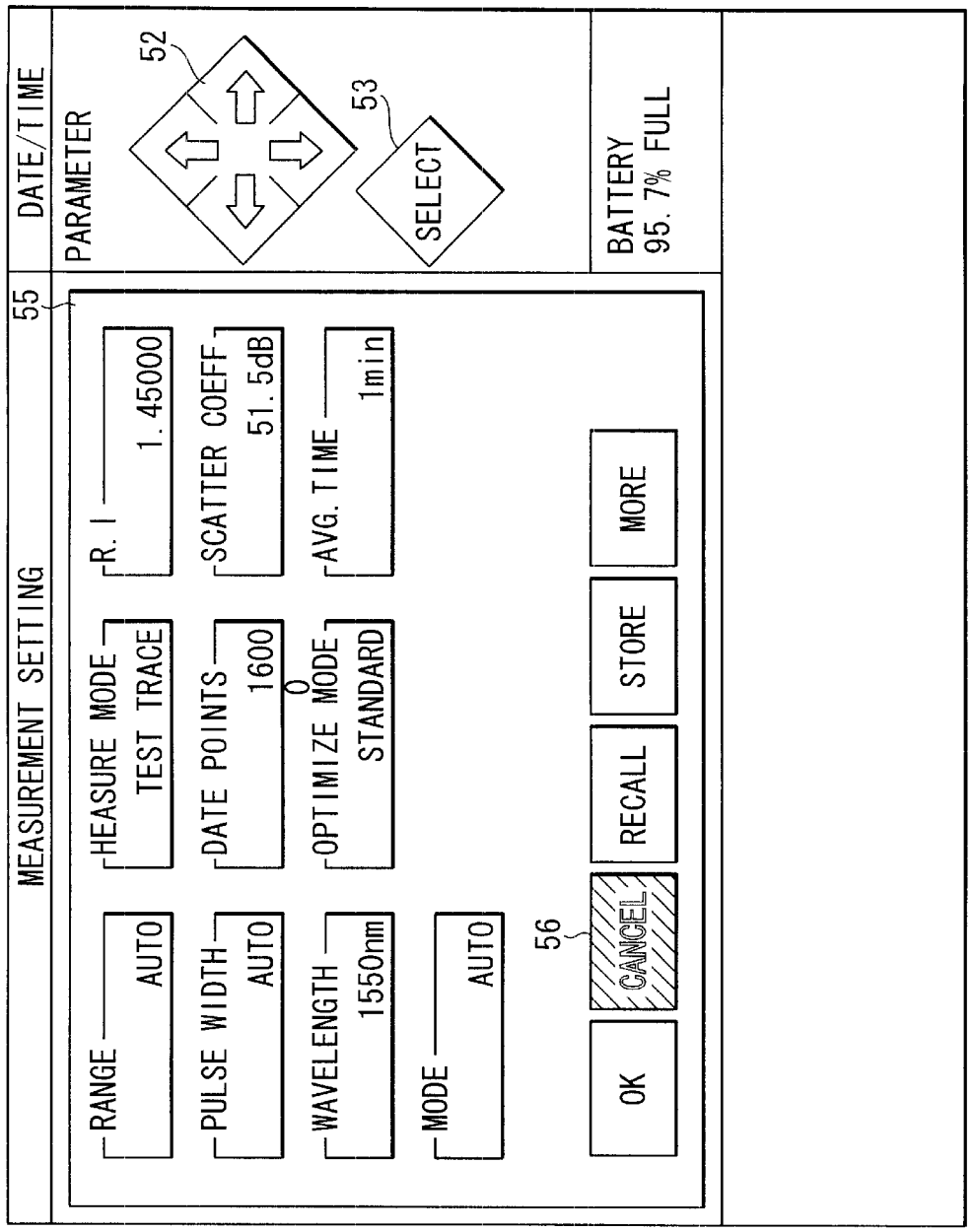
FIG. 7 is a view showing a display screen when selecting various items of a conventional measuring apparatus disclosed in U.S. Pat. No. 5,801,943, and shows a display screen of a lower hierarchy of FIG. 6.

The construction and operation relative to measurement in the OTDR which is applied to a measurement data display apparatus according to one embodiment of the present invention are the substantially same as the conventional OTDR 31 shown in FIG. 5; therefore, their details are omitted.

The OTDR of this embodiment, includes a control panel 1 at its front side.

The control panel 1 is provided with a display section 40, that is, a main screen 2 for displaying a screen having various functions, inclusive of a waveform display and a data display showing a measurement result of a measured optical fiber.

In the OTDR of this embodiment, as will be described later, in the case of carrying out setting relative to items other than a fundamental measurement for measuring characteristics such as a loss and fault point of a measured optical fiber at a desired spot on the basis of information preset in an apparatus, a secondary screen 3 pops up and is displayed on the main screen 2 functioning as the display section 40.

In this case, the setting relative to items other than a fundamental measurement includes the following settings; for example, continuous measurement is made such that measurement is made with respect to different optical fibers under the same condition without varying basic setting, or such that measurement is made so as to vary a wavelength of optical pulse incident upon one optical fiber in succession, and further, a comparison of waveform data, file save and recall are executed.

As shown in FIG. 1, an input section 22 is provided on a right-hand side of the control panel 1 main body, and various input keys are arranged therein. More specifically, the input keys include a menu key 4, a plurality of function keys (hereinafter, referred to as F key) 5 (F1 to F5), an arrow key 6, an encoder 7, a start key 8 and a select key 9.

As will be described later, in a state that only main screen 2 is displayed, when the menu key 4 is pushed, a secondary screen 3 pops up and is displayed on the main screen 2.

Moreover, in a state that the secondary screen 3 is displayed, when the menu key 4 is pushed, the secondary screen 3 is closed.

During measurement of the measured optical fiber W (waveform sweepage), when the menu key 4 is pushed, the push-down information is handled as being invalid.

Further, when the menu key 4 is pushed during setting, the setting thus far is canceled, and then, the secondary screen 3 pops up and is displayed.

The F keys 5 (F1 to F5) are vertically arranged on a right-hand side of the main screen 2 in the control panel 1.

Each of the F keys 5 (F1 to F5) has a function allocated so as to correspond to an item menu displayed on the main screen 2 or secondary screen 3. When one of the F keys 5 is pushed, a screen corresponding to the function of the pushed F key 5 is displayed.

The functions allocated to the F keys 5 are as follows.

For example, the F1 key has a function of displaying a Setup screen for setting a measurement condition when being pushed in a state of displaying only main screen 2.

The F2 key has a function of selecting and displaying lower hierarchy functions when being pushed in a state of displaying only main screen 2.

The F3 key has a function of displaying a screen of measured kinds when being pushed in a state of displaying only main screen 2.

The F4 key has a function of modifying a setting of approximation curve used when carrying out measurement when being pushed in a state of displaying only main screen 2.

The F5 key has a function of displaying a screen for (automatically or manually) setting an arrangement of markers which is arranged on a waveform screen of the main screen 2 and used for determining a measuring point.

The arrow key 6 is composed of four directions, that is, up and down and right and left keys 6a, 6b, 6c and 6d, and is operated when selecting a desired item in the main screen 2 or the secondary screen 3.

In particular, in a state that the secondary screen 3 is displayed, when the down key 6b is pushed, a selection item of the large item menu 10 described later of the secondary screen 3 is moved in succession from above to below so that it is distinguished from non-selection items and is displayed.

On the contrary, when the up key 6a is pushed, a selection item of the large item menu 10 is made in succession from below to above so that it is distinguished from non-selection items and is displayed.

A knob-shaped encoder 7 has a function equal to the arrow key 6.

In particular, in a state that the secondary screen 3 is displayed, when rotating the encoder 7 to a clockwise direction, the selection item of the large item menu 10 of the secondary screen 3 is shifted in succession from above to below so that it is distinguished from non-selection items, and then, is displayed.

On the contrary, when rotating the encoder 7 to a counterclockwise direction, the selection item of the large item menu 10 of the secondary screen 3 is moved in succession from below to above so that it is distinguished from non-selection items, and then, is displayed.

In a display for distinguishing the selection item from the non-selection item, for example, in the case where the display screen is monochrome display, the selection item is reversed and displayed.

Moreover, in the case where the display screen is a full-color display, light and shade are used in the same color; more specifically, a display color of the selection item is made dark; on the other hand, a display color of the non-selection item is made light.

The start key 8 is pushed when starting a measurement of the measured optical fiber W under set conditions.

The select key 9 is used when a desired item is selected from a small item menu 11 of the secondary screen 3 described later by:pushing the F key 5, and in a state that a screen having a function of the selected item is displayed on the main screen 2, together with the arrow key 6 and the encoder 7.

As shown in FIG. 1, the secondary screen 3 pops up and is displayed on the main screen 2 at a position near to the F key 5 when the menu key 4 is pushed.

On the secondary screen 3, a plurality of large item menus 10 selectable as an item other than fundamental measurement are displayed, and simultaneously, a small item menu 11 selectable for each large item menu 10 is displayed, so that each function of the small item menu 11 corresponds to each F key 5.

The large item menu 10 and the small item menu 11 individually comprise a rectangular-shaped window, and each item is displayed in the window.

These large item menu 10 and small item menu 11 are conformable to the standards relative to the OTDR by GENERIC REQUIREMENTS GR-196-CORE ISSUE 1, September 1995 (Generic Requirements for Optical time Domain Reflectometer (OTDR) Type Equipment, Bellcore (Bell Communications Research)), pp B-1 to B-12.

As seen from the example shown in FIG. 1, the large item menu 10 includes five large item menus, that is, a "File" large item menu 10A for executing save, recall and print of waveform data, an "Application large item menu 10B for executing a comparison and continuous measurement of waveform data, an "Event" large item menu 10C for executing an input of event comment and land mark in a waveform display screen, a "Configuration" large item menu 10D for executing various settings, and a "Display" large item menu 10E for executing a display setup.

The above five large item menus 10A to 10E are displayed in a state of being vertically arranged in plural lines on a left-hand side of the secondary screen 3, and one large item menu 10 presently selecting is displayed so as to distinguish from other non-select large item menus 10.

In the example shown in FIG. 1, the slanted "File" large item menu 10A is a selected item, and is displayed so as to distinguish from other large item menus 10B to 10E.

Simultaneously, on the secondary screen 3, a selectable small item menu 11 of the selected large item menu 10 is displayed so as to correspond to each position of the F key 5.

More specifically, when the "File" large item menu 10A is identified and displayed as a selection item, five selection candidate items relative to the "File" menu are displayed as a small item menu to be allocated to F keys F1 to F5.

The small item menu 11 of the "File" large item menu 10A includes a "Save" small item menu for displaying a screen having a file save function, a "Recall" small item menu for displaying a screen having a file recall function, a "Print" small item menu for displaying a screen having a print function, a "Continuous Print" small item menu for displaying a screen having a continuous print function, and a "File Utility" small item menu for displaying a screen having a file utility function.

Then, when the "File" large item menu 10A is identified and displayed as a selection item, the F1 key is correspondent to the "Save" small item menu, the F2 key is correspondent to the "Recall" small item menu, the F3 key is correspondent to the "Print" small item menu, the F4 key is correspondent to the "Continuous Print" small item menu, and the F5 key is correspondent to the "File Utility" small item menu, respectively.

When the "Application" large item menu 10B is identified and displayed as a selection item, two selection candidate items relative to the "Application" menu are displayed as a small item menu to be allocated to F1 key and F2 key.

The small item menu 11 of the "Application" large item menu 10B includes a "Repeat task" small item menu for displaying a screen having a continuous measurement function, and "Wave compare" small item menu for displaying a screen having a waveform comparing function.

Then, when the "Application" large item menu 10B is identified and displayed as a selection item, the F1 key is correspondent to the "Repeat task" small item menu, and the F2 key is correspondent to the "Wave Compare" small item menu, respectively.

When the "Event" large item menu 10C is identified and displayed as a selection item, two selection candidate items relative to an event information input confirm menu are displayed as a small item menu 11 to be allocated to F1 key and F2 key.

The small item menu 11 of the "Event" large item menu 10C includes a "Event comment" small item menu for inputting an event comment, and corresponding to the F1 key, and a "Land mark" small item menu for inputting a land mark, and corresponding to the F2 key.

When the "Configuration" large item menu 10D is identified and displayed as a selection item, five selection candidate items relative to various settings are displayed as a small item menu to be allocated individually to F1 to F5 keys.

A small item menu 11 of the "Configuration" large item menu 10D includes a "System" small item menu for displaying an equipment setting (time setting, etc.) screen, a "Printer setting" small item menu for displaying a printer type setting screen, a "Serial port" small item menu for displaying a screen for setting an RS232C which is a communication interface, an "Optical switch" small item menu for displaying an optical switch setting screen, and a "Self test" small item menu for carrying out a self-diagnostic test of equipments.

Then, when the "Configuration" large item menu 10D is identified and displayed as a selection item, the F1 key is correspondent to the "System" small item menu, the F2 key is correspondent to the "Printer setting" small item menu, the F3 key is correspondent to the "Serial port" small item menu, the F4 key is correspondent to the "Optical switch" small item menu, and the F5 key is correspondent to the "Self test" small item menu, respectively.

Figure 2A:
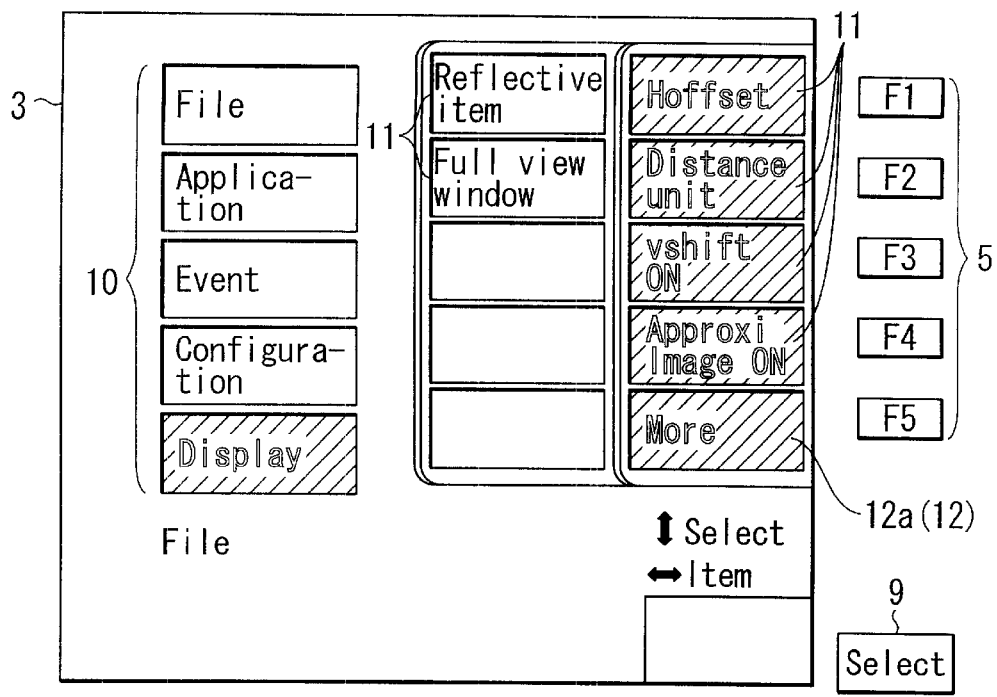
FIG. 2A and FIG. 2B are individually views showing a secondary screen when "Display" is identified and displayed as a selection item from a large menu on the secondary screen shown in FIG. 1.
Figure 2B:
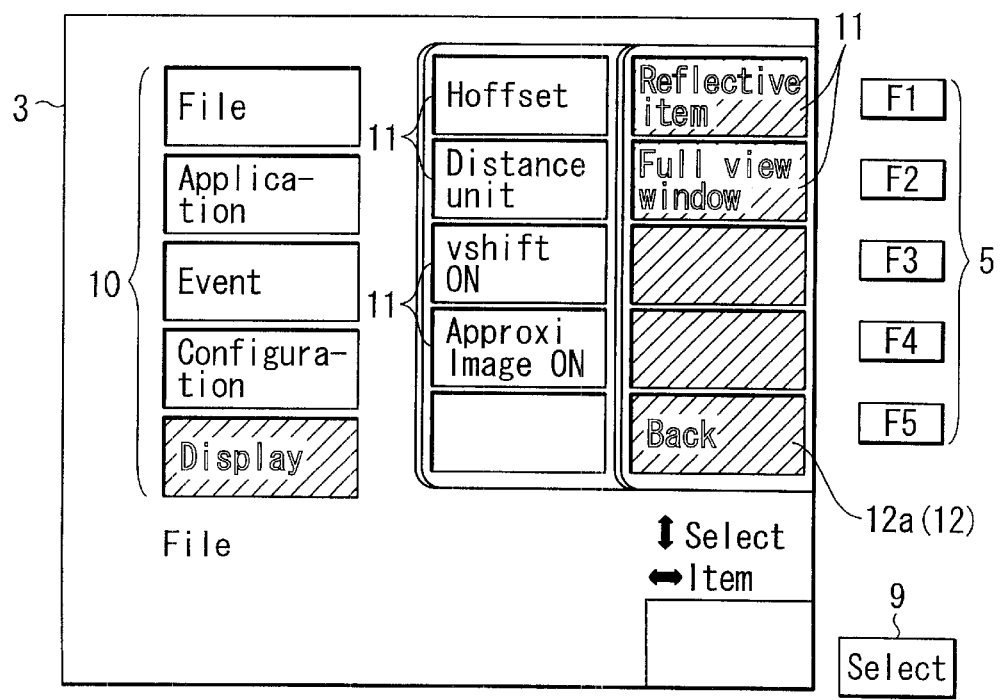

In this embodiment, when the "Display" large item menu 10E is identified and displayed as a selection item, a selectable small item menu is more than the number of the F keys 5; for this reason, a display form as shown in FIG. 2A and FIG. 2B is employed.

A small item menu 11 of the. "Display" large item menu 10 includes a "Horizontal offset" small item menu (abbreviated as "Hoffset" in FIG. 2B) for displaying a horizontal axis offset setting screen, a "Distance unit" small item menu for displaying a distance unit setting screen, a "Vshift ON" small item menu for displaying an automatic vertical axis on/off screen, an "Approxi image ON" small item menu for displaying an approximation straight line image on/off screen, a "Reflective Item" small item menu for displaying a reflectivity measurement method setting screen, and a "Full View window" small item menu for displaying a screen for setting a display position of the Full View window.

In this case, the above "Horizontal offset" small item menu (abbreviated as "Hoffset" in FIG. 2B) is equivalent to "User Offset" in the standards relative to the OTDR by GENERIC REQUIREMENTS GR-196-CORE ISSUE 1, September 1995 (Generic Requirements for Optical time Domain Reflectometer (OTDR) Type Equipment, Bellcore (Bell Communications Research)), pp B-1 to B-12.

Besides, a switching menu 12 ("More" menu 12a, "Back" menu 12b) for switching a selectable small item menu are provided.

As shown FIG. 2A, when the "Display" large item menu 10E is identified and displayed as a selection item, a small item menu 11 is displayed in a state of being arranged in right and left two lines on the secondary screen 3. A right-hand side small item menu 11 near to the F key 5 side selectable by the F key 5 is identified and displayed as a selection candidate items (identified and displayed in the same manner as described the large item menu 10, for example, reverse display, display using light and shade in the same color, etc.)

More specifically, as shown in FIG. 2A, regarding the F1 key, when the "Hoffset" small item menu corresponding to the F1 key is identified and displayed as a selection item, a selection of the "Hoffset" small item menu by the F1 key is executable.

In this case, in a window on a left-hand side of the "Hoffset" small item menu, the "Reflective Item" small item menu is displayed; however, the selection and execution of the "Hoffset" small item menu by the F1 key is inhibited.

Then, as shown in FIG. 2A, regarding the F2 key, when the "Distance unit" small item menu corresponding to the F2 key is identified and displayed as a selection item, a selection of the "Distance unit" small item menu by the F2 key is executable.

In this case, in a window on a left-hand side of the "Distance unit" small item menu, the "Full View window"

small item menu is displayed; however, the selection and execution of the "Full View window" small item menu by the F2 key is inhibited.

As shown in FIG. 2A, regarding the F3 key, when the "Vshift ON" small item menu corresponding to the F3 key is identified and displayed as a selection item, a selection of the "Vshift ON" small item menu by the F3 key is executable.

In this case, a window on a left-hand side of the "Vshift ON" small item menu is displayed in a state of being blank.

As shown in FIG. 2A, regarding the F4 key, when the "Approxi image ON" small item menu corresponding to the F4 key is identified and displayed as a selection item, a selection of the "Approxi image ON" small item menu by the F4 key is executable.

In this case, a window on a left-hand side of the "Approxi image ON" small item menu is displayed in a state of being blank.

As shown in FIG. 2A, regarding the F5 key, when the "More" menu 12a corresponding to the F5 key is identified and displayed as a selection item, a selection of the "More" menu by the F5 key is executable.

In a state that the "More" menu 12a is identified and displayed as a selection item, when the F5 key is pushed, as shown in FIG. 2B, the "Reflective Item" small item menu corresponding to the F1 key is identified and displayed as a selection item, and then, a selection of the "Reflective Item" small item menu by the F1 key is executable.

In this case, in a window on a left-hand side of the "Reflective Item" small item menu, the "Hoffset" small item menu is displayed; however, the selection and execution of the "Hoffset" small item menu by the F1 key is inhibited.

As shown in FIG. 2B, regarding the F2 key, when the "Full View window" small item menu corresponding to the F2 key is identified and displayed as a selection item, a selection of the "Full view window" small item menu by the F2 key is executable.

In this case, in a window on a left-hand side of the "Full View window" small item menu, the "Distance unit" small item menu is displayed; however, the selection and execution of the "Distance unit" small item menu by the F2 key is inhibited.

As shown in FIG. 2B, regarding the F3 key, a right-hand side window corresponding to the F3 key is displayed in a state of being blank.

In this case, in a left-hand side window corresponding to the F3 key, the "Vshift ON" small item menu is displayed; however, the selection and execution of the "Vshift ON" small item menu by the F3 key is inhibited.

As shown in FIG. 2B, regarding the F4 key, a right-hand side window corresponding to the F4 key is displayed in a state of being blank.

In this case, in a left-hand side window corresponding to the F4 key, the "Approxi image ON" small item menu is displayed; however, the selection and execution of the "Approxi image ON" small item menu by the F4 key is inhibited.

As shown in FIG. 2B, regarding the F5 key, the "Back" menu 12b corresponding to the F5 key is identified and displayed as a selection item.

In this case, a left-hand side window of the "Back" menu 12b is displayed in a state of being blank.

In a state that the above "Back" menu 12b is identified and displayed as a selection item, when the F5 key of the F key 5 is pushed, the presently displayed screen is returned to the aforesaid secondary screen 3 shown in FIG. 2A.

Incidentally, the above construction may be employed in the same manner to other large item menus 10A to 10D.

If the number of selectable small item menus of the "Display" large item menu 10E is less than the number of the F keys 5, in the same manner as other large item menus 10A to 10D, a selectable small item menu may be displayed so as to correspond to the F key 5 one by one.

Figure 3:
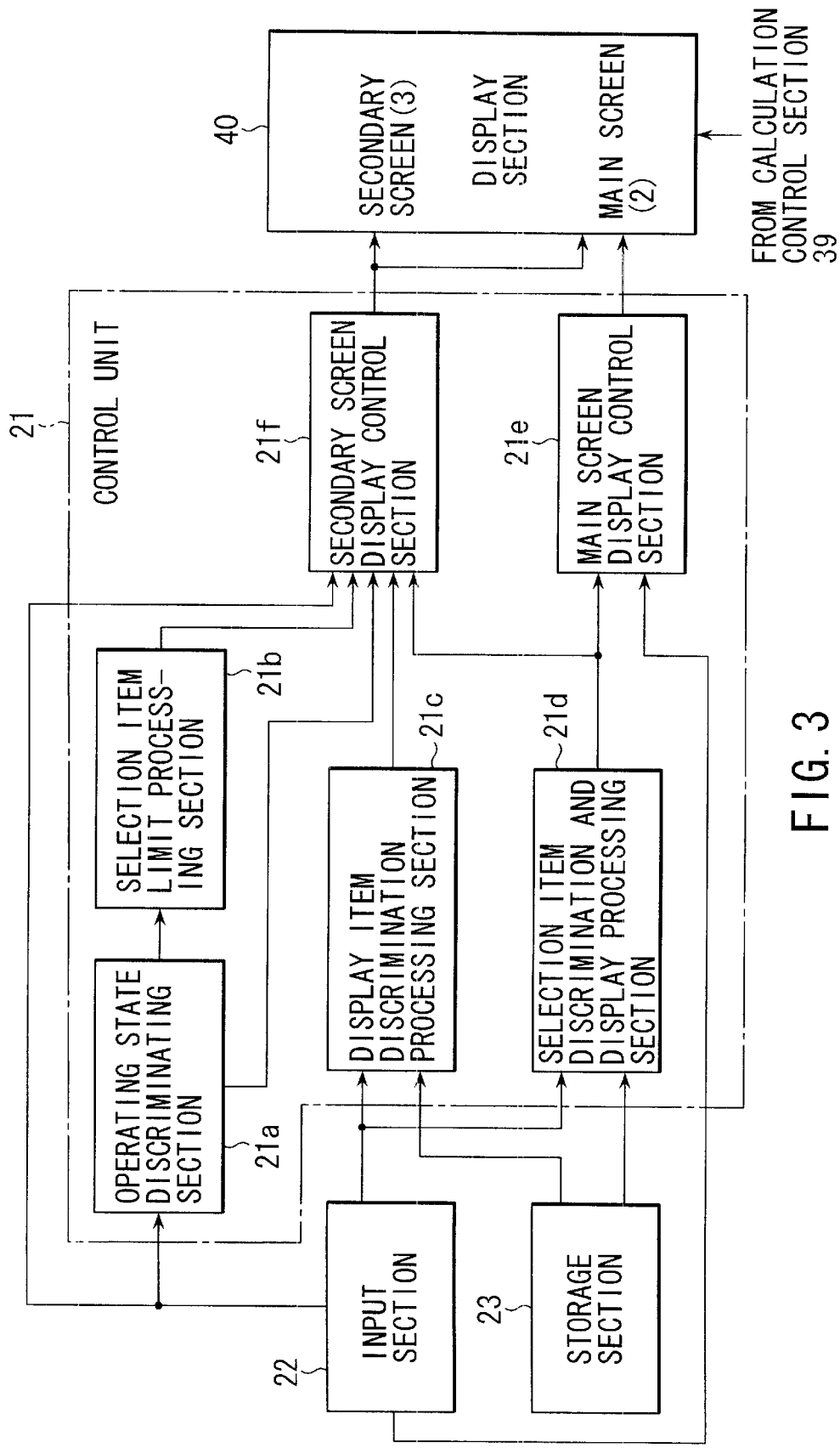
FIG. 3 is a functional block diagram showing a construction of a control section relative to display processing of the secondary screen shown in FIG. 1.

FIG. 3 is a functional block diagram showing a construction of a control unit 21 for carrying out a display procedure including a pop-up display of the aforesaid secondary screen 3.

As shown in FIG. 3, a control unit (CPU) 21 comprises an operating state discriminating section 21a, a selection item limit processing section 21b, a display item discrimination processing section 21c, a selection item discrimination and display processing section 21d, a main screen display control section 21e, and a secondary screen display control section 21f.

An input section 22 shown in FIG. 3 includes the aforesaid menu key 4, F keys 5 (F1 to F5), arrow key 6, encoder 7, start key 8, and select key 9.

Further, a storage (memory) section 23 shown in FIG. 3 stores a data of the large item menu 10 of the secondary screen 3, and a data of the small item menu 11 corresponding to each F key 5 (F1 to F5) for each large item menu 10.

Furthermore, a display control information of the main screen 2 and a display control information of the secondary screen 3 are supplied to a display section 40 shown in FIG. 3 from the main screen display control section 21e and the secondary screen display control section 21f, and a measurement data of the OTDR 31 is supplied thereto from the calculation control section 39 shown in FIG. 5.

The operating state discriminating section 21a discriminates an operating states as to whether the measured optical fiber W is being measured, setting is made in the main screen 2, or the main screen 2 opens a Setup screen during measurement, and thereby, outputs a discrimination signal of each operating state while outputting a signal as to whether an input information when the menu key 4 is pushed in accordance with the operating state is valid or invalid, to the secondary screen display control section 21f.

More specifically, the start key 8 is pushed, and thereafter, in the case where the operating state discriminating section 21a makes a decision such that the menu key 4 is pushed when the measured optical fiber W is being measured, the operating state discriminating section 21a outputs a signal for making invalid the input information of the menu key 4 to the secondary screen display control section 21f.

In the case where the operating state discriminating section 21a makes a decision such that the menu key 4 is pushed when setting is made in the main screen 2, the operating state discriminating section 21a outputs a signal for making valid the input information of the menu key 4 to the secondary screen display control section 21f.

Moreover, in the case where the start key 8 is pushed, and the measured optical fiber W is being measured, and then, the operating state discriminating section 21a makes a decision such that the menu key 4 is pushed in a state that the Setup screen is opened in the main screen 2, the operating state discriminating section 21a outputs a discrimination signal to the selection item limit processing section 21b while outputting a signal for making valid the input information of the menu key 4 to the secondary screen display control section 21f.

The selection item limit processing section 21b outputs an item limit information to the secondary screen display control section 21f so as to limit the small item menu 11 selectable on the secondary screen 3 on the basis of the discrimination signal from the operating state discriminating section 21a.

More specifically, when inputting a discrimination signal such that the Setup screen is opened during measurement, from the operating state discriminating section 21a, the selection item limit processing section 21b outputs an item limit information to the secondary screen display control section 21f so as to limit an item menu selectable on the secondary screen 3 to only "Print" small item menu.

The display item discrimination processing section 21c reads the data of the large item menu 10 and the small item menu 11 from the storage section 23, and then, discriminates a menu which is a selection display object on the basis of the input information from the arrow key 6 or the encoder 7, and thereby, outputs a display information to the secondary screen display control section 21f so that the relevant large item menu 10 and a window of its small item menu 11 are displayed to be distinguished from other menus.

In this case, unless the input information from the arrow key 6 or the encoder 7 is provided, the display item discrimination processing section 21c outputs a display information to the secondary screen display control section 21f so that the "File" large item menu 10A and its small item menu 11A are identified as a selection item and are displayed on the secondary screen 3.

The selection item discrimination and display processing section 21d reads the data of the large item menu 10 and the small item menu 11 from the storage section 23, and then, discriminates a selected item on the basis of the input information from the F key 5, and thereby, outputs a display processing information to the main screen display control section 21e and the secondary screen display control section 21f so that a screen having a function of the relevant selection item is displayed on the main screen 2 and so that a pop-up display on the secondary screen 3 disappears.

The main screen display control section 21e controls a display of the main screen 2 on the basis of the input information from the input section 22 and a display processing information from the selection item discrimination and display processing section 21d.

The secondary screen display control section 21f controls a display (pop-up, disappearance) of the secondary screen including the identification and display of the large item menu 10 and the small item menu 11 on the basis of the input information from the input section 22, the discrimination signal from the operating state discriminating section 21a and the signal indicating whether the menu key 4 is valid or invalid, the item limit information from the selection item limit processing section 21b, the display information from the display item discrimination processing section 21c, and the display processing information from the selection item discrimination and display processing section 21d.

Next, a display processing operation of the secondary screen 3 carried out by the above control unit 21 will be described below with reference to the flowchart shown in FIG. 4.

When the menu key 4 of the control panel 1 is pushed (step ST1:Yes), the control unit 21 displays the selectable "File" large item menu 10A and its small item menu 11 on the display section 40 in a state of being distinguished from other non-selectable menu, and then, pops up and displays the secondary screen 3 (step ST2).

In a state that the secondary screen 3 pops up and is displayed, when the arrow key 6 or the encoder 7 is not operated (step ST3:No) and the F key 5 is pushed (step ST4:Yes), the above control unit 21 enables a selection of the small item menu 11 corresponding to the pushed F key 5.

For example, when the F3 key is pushed, the "Print" small item menu corresponding to the F3 key is selected.

Then, the control unit 21 shifts (moves) the display section 40 to the above selected small item menu screen, and then, erases a pop-up display of the secondary screen 3 (step ST5).

Subsequently, when the arrow key 6 or the encoder 7 is operated (step ST3:Yes), the above control unit 21 identifies and displays the relevant large item menu 10 and its small item menu 11 unless the selected large item menu 10 is the "Display" large item menu 10E (step ST7).

For example, when the "Event" large item menu 10C is selected by the operation of the arrow key 6, the above control unit 21 identifies and displays the "Event" large item menu 10C and its small item menu 11 so that these menu is selectable.

Thereafter, the above control unit 21 transfers to a process of the step ST4.

In this case, unless the F key 5 is pushed (step ST4:No), the control unit 21 returns to a process of the step ST3.

If the selected large item menu 10 is the "Display" large item menu 10E (step ST6:Yes), as shown in FIG. 2A, the control unit 21 identifies and displays the "Display" large item menu 10E so that it is selectable, and simultaneously, displays its small item menu 11 in tow plural lines so as to correspond to the F key 5.

In this case, the control unit 21 displays a selectable small item menu 11 and the switching menu 12a on the right-hand window (step ST8).

At this time, on the left-hand window, a non-selectable small item menu 11 is displayed.

In the aforesaid state, unless the F5 key of the F keys 5 corresponding to the "More" menu 12a is pushed (step ST9:No), the control unit 21 transfers to a process of the step ST4.

When the F5 key of the F keys 5 corresponding to the "More" menu 12a is pushed (step ST9:Yes), as shown in FIG. 2B, the control unit 21 switches the selectable small item menu 11 and the switching menu 12b to the right-hand window, and then, identifies and displays them (step ST10).

At this time, on the left-hand window, a non-selectable small item menu 11 is displayed.

In the aforesaid state, unless the F5 key of the F keys 5 corresponding to the "Back" menu 12b is pushed (step ST11:No), the control unit 21 transfers to a process of the step ST4.

When the F5 key of the F keys 5 corresponding to the "Back" menu 12b is pushed (step ST11:Yes), the control unit 21 executes a process for returning to the secondary screen 3 of the step ST8.

Figure 4:
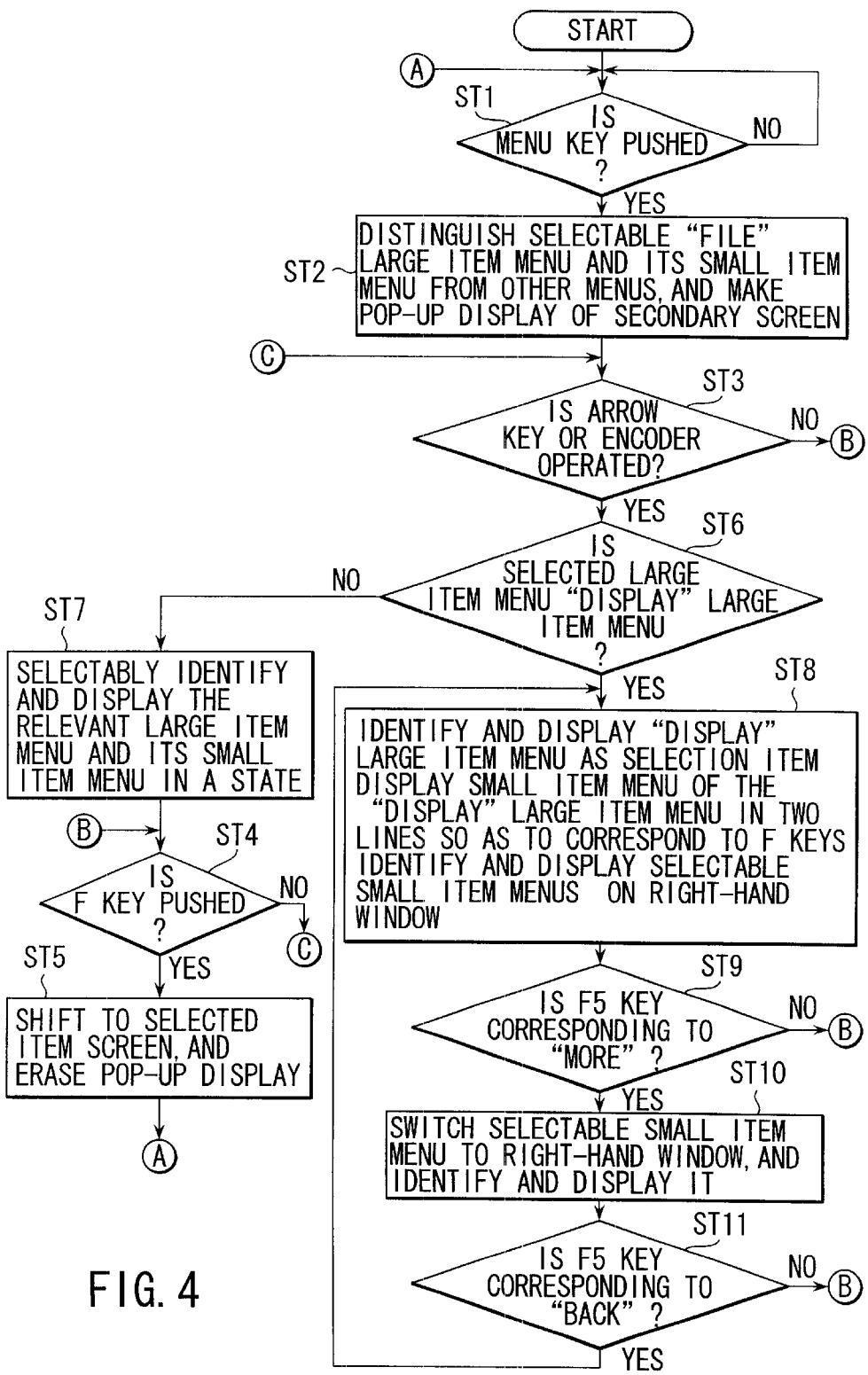
FIG. 4 is a flowchart showing a procedure of a control section relative to display processing of the secondary screen shown in FIG. 1.

Although no illustration in the flowchart of FIG. 4, in a state that the secondary screen 3 is displayed, when the menu key 4 is pushed, a pop-up display of the secondary screen 3 disappears.

Moreover, when the menu key 4 is pushed during measurement of the measured optical fiber (during waveform sweepage), the input information of the menu key 4 becomes invalid, and then, even if the menu key 4 is pushed, no pop-up display of the secondary screen 3 is made.

However, even if the measured optical fiber is being measured, in the case where the Setup screen is opened in the main screen 2, when the menu key 4 is pushed, a pop-up display of the secondary screen 3 is made.

In this case, the small item menu 11 selectable by the F key 5 is limited to only "Print" item menu.

When the menu key 4 is pushed in the middle of desired setting in the main screen 2, the setting contents are canceled, and then, the secondary screen 3 pops up and is displayed.

As described above, according to this embodiment, it is possible to display a frequently used screen relative to fundamental measurement of the measured optical fiber and a screen relative to items other than the fundamental measurement in a state that these screen are divided.

In the case of selecting and setting items other than the fundamental measurement, it is possible to reduce a work of tracing to the lowest hierarchy screen.

In addition, a plurality of large item menus 10 and the small item menus 11 which are correspondent to the F keys (F1 to F5) for each large item menu 10 so as to be shifted to the lowest hierarchy, are displayed in one secondary screen 3 which pops up and is displayed on the main screen 2. Therefore, it is possible to reduce not only the number of hierarchies of the screen but also the number of operations of the arrow key and the encoder.

Further, the items included in the large item menu 10 are recognized at a glance; therefore, it is possible to quickly find out a target function, and thus to perform a switch-over of screen.

Further, the presently selected large item menu 10 is identified and displayed so as to be distinguished from other non-selected large item menu, and an executable small item menu of the small item menus 11 of the large item menu 10 is identified and displayed so as to be distinguished from non-executable small item menu. Furthermore, the non-executable small item menu is displayed so that its window is displayed in a state of being blank or a character color of the item name is changed. Therefore, it is possible to confirm the present display situation at a glance, and thus, to achieve a reduction of an operation mistake.

By the way, the above embodiment has described the case where the large item menu 10 displayed on the secondary screen 3 is five. Five or more large item menus 10 may be listed up.

Unless it is possible to secure a display area for listing up the large item menu 10 on the secondary screen 3, the large item menu 10 may be scrolled using the arrow key 6 or the encoder 7 of the control panel 1 so as to be displayed in the window.

As is evident from the above description, according to the present invention, in the measurement data display apparatus, it is possible to display a frequently used screen relative to fundamental measurement of the measured optical fiber and a screen relative to items other than the fundamental measurement in a state that these screen are divided.

In addition, a plurality of large item menus 10 and the small item menus which are correspondent to the F keys for each large item menu 10 so as to be shifted to the lowest hierarchy, are displayed in one secondary screen 3 which pops up and is displayed on the main screen 2. Therefore, it is possible to reduce not only the number of hierarchies of the screen but also the number of operating times of other keys (e.g., arrow key, encoder). Further, the items included in the large item menu are recognized at a glance; therefore, it is possible to quickly find out a target function, and thus to perform a switch-over of screen.

In particular, according to the aforesaid second invention, the presently selected large item menu is identified and displayed so as to be distinguished from non-selectable large item menu, and an executable small item menu of the small item menus of the large item menu is identified and displayed so as to be distinguished from non-selectable small item menu. Further, the non-executable small item menu is displayed so that its window is displayed in a state of being blank or a character color of the item name is changed. Therefore, it is possible to confirm the present display situation at a glance, and thus, to achieve a reduction of an operation mistake.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A measurement data display apparatus comprising:

an input section provided on a front side of the measurement data display apparatus, and including at least a first key, a second key and a plurality of function keys;

a display, also provided on the front side of the measurement data display apparatus, for displaying a main screen showing fundamental measurement data of the measured object; and a control section, responsive to an operation of the first key of the input section, for popping up on the main screen a secondary screen which simultaneously includes a plurality of large item menus relating to additional measurement data of the measured object and a plurality of small item menus corresponding to each of the plurality of large item menus, wherein each of the plurality of small item menus are displayed at a position corresponding to each of the plurality of function keys of the input section, wherein one of the plurality of large item menus is enabled to be selected by operating the second key of the input section, and wherein at least one of the plurality of small item menus corresponding to the selected one of the large item menus is enabled to be selected responsive to an operation of at least one of the plurality of function keys of the input section.

2. The measurement data display apparatus according to claim 1, wherein the control section identifies and displays the plurality of large item menus and the plurality of small item menus so that the control section distinguishes and displays a presently selected large item menu and a presently non-selected large item menu, and distinguishes and displays an executable small menu of the selected large item menu, and a non-executable small item menu.

3. The measurement data display apparatus according to claim 1, wherein in the case of displaying the plurality of small item menus, the control section displays the plurality of small item menus in plural lines so as to correspond to a number of the plurality of function keys when a number of the plurality of small item menus are more than the number of the plurality of function keys, and displays a switching menu for switching one of the small item menus of plural lines selectable by one of the plurality of function keys so that the switching menu is allocated to function keys other than the function key corresponding to the small item menu.

4. The measurement data display apparatus according to claim 1, wherein the large item menus include items relative to save, recall and print of waveform data, a comparison of waveform data and a continuous measurement, and an item relative to an input of an event comment and a land mark in a waveform display screen.

5. The measurement data display apparatus according to claim 4, wherein the plurality of large item menus comprise:
 a "File" large item menu for carrying out the save, the recall and the print of waveform data;
 an "Application" large item menu for carrying out the comparison of waveform data and the continuous measurement;
 an "Event" large item menu for inputting the event comment and the land mark in the waveform display screen;
 a "Configuration" large item menu for carrying out various settings; and
 a "Display" large item menu for carrying out a display setup.

6. The measurement data display apparatus according to claim 5, wherein the small item menu corresponding to the "File" large item menu comprises:
 a "Save" small item menu for displaying a screen having a file save function;
 a "Recall" small item menu for displaying a screen having a file recall function;
 a "Print" small item menu for displaying a screen having a print function;
 a "Continuous Print" small item menu for displaying a screen having a continuous print function; and
 a "File Utility" small item menu for displaying a screen having a file utility function.

7. The measurement data display apparatus according to claim 6, wherein when the "File" large item menu is identified and displayed as a selection item, a first F key is set to correspond to the "Save" small item menu, a second F key is set to correspond to the "Recall small item menu, a third F key is set to correspond to the "Print" small item menu, a fourth F key is set to correspond to the "Continuous Print" small item menu, and a fifth F key is set to correspond to the "File Utility" small item menu.

8. The measurement data display apparatus according to claim 5, wherein when the "Application" large item menu is identified and displayed as a selection item, two selection candidate items relative to the "Application" menu are displayed as a small item menu to be allocated to a first F key and a second F key of the plurality of function keys.

9. The measurement data display apparatus according to claim 8, wherein the small item menu corresponding to the "Application" large item menu comprises:
 a "Repeat task" small item menu for displaying a screen having a continuous measurement function; and
 a "Wave compare" small item menu for displaying a screen having a waveform comparing function.

10. The measurement data display apparatus according to claim 9, wherein when the "Application" large item menu is identified and displayed as a selection item, the first F key of the plurality of function keys is set to correspond to the "Repeat task" small item menu, and the second F key is set to correspond to the "Wave Compare" small item menu.

11. The measurement data display apparatus according to claim 5, wherein when the "Event" large item menu is identified and displayed as a selection item, two selection candidate items relative to an event information input confirm menu are displayed as a small item menu to be allocated to a first F key and a second F key of the plurality of function keys.

12. The measurement data display apparatus according to claim 11, wherein in the small item menu of the "Event" large item menu, the first F key of the plurality of function keys is set to correspond to an "Event comment" small is item menu for inputting the event comment, and the second F key is set to correspond to a "Land mark" small item menu for inputting the land mark.

13. The measurement data display apparatus according to claim 5, wherein when the "Configuration" large item menu is identified and displayed as a selection item, five selection candidate items relative to various settings are displayed as a small item menu to be allocated respectively to first to fifth F keys of the plurality of function keys.

14. The measurement data display apparatus according to claim 13, wherein a small item menu corresponding to the "Configuration" large item menu comprises:
 a "System" small item menu for displaying a screen for setting equipments inclusive of time setting;
 a "Printer" setting small item menu for displaying a screen for setting a printer type;
 a "Serial port" small item menu for displaying a screen for setting a communication interface;
 an "Optical switch" small item menu for displaying a screen for setting an optical switch; and
 a "Self test" small item menu for carrying out a self-diagnostic test.

15. The measurement data display apparatus according to claim 14, wherein when the "Configuration" large item menu is identified and displayed as a selection item, the first F key of the plurality of function keys is set to correspond to the "System" small item menu, the second F key is set to correspond to the "Printer setting" small item menu, the third F key is set to correspond to the "Serial port" small item menu, the fourth F key is set to correspond to the "Optical switch" small item menu, and the fifth F key is set to correspond to the "Self test" small item menu.

16. The measurement data display apparatus according to claim 5, wherein a small item menu corresponding to the "Display" large item menu comprises:
 a "Horizontal offset" small item menu for displaying a screen for setting a horizontal axis offset;
 a "Distance unit" small item menu for displaying a screen for setting a distance unit;
 a "Vshift ON" small item menu for displaying an automatic vertical axis on/off screen;
 an "Approxi image ON" small item menu for displaying an approximation straight line image on/off screen;
 a "Reflective Item" small item menu for displaying a screen for setting a reflectivity measurement method; and
 a "Full View window" small item menu for displaying a screen for setting a display position of a Full View window.

17. The measurement data display apparatus according to claim 16, wherein when the "Display" large item menu is identified and displayed as a selection item two lines of small item menus are displayed in a state of being arranged in right and left two plural lines on the secondary screen, and a right-hand side small item menu near to a side of the plurality of function keys by the fifth F key of the plurality of function keys is identified and displayed as a selection candidate item.

18. The measurement data display apparatus according to claim 1, wherein the plurality of function keys comprise:
  a first F key having a function of displaying a Setup screen for setting a measurement condition when being pushed in a state that only the main screen is displayed;
  a second F key having a function of displaying a lower hierarchy selection screen;
  a third F key having a function of displaying a screen relative to a kind of measurements;
  a fourth F key having a function of modifying setting of an approximation curve used in the case of carrying out a measurement; and
  a fifth F key having a function of displaying an arrangement setting screen of markers which is arranged on a waveform screen on the main screen and is used for determining a measuring point.

19. The measurement data display apparatus according to claim 1, wherein the control section comprises:
  an operating state discriminating section;
  a selection item limit processing section;
  a display item discrimination processing section;
  a selection item discrimination and display processing section;
  a main screen display control section; and
  a secondary screen display control section,
  wherein the control section comprises an operating state discriminating section, a selection item limit processing section, a display item discrimination processing section, a selection item discrimination and display processing section, a main screen display control section, and a secondary screen display control section, and
  wherein:
    the operating state discriminating section discriminates operating states as to whether an optical fiber as the measured object is being measured, setting is made in the main screen, and the main screen opens a Setup screen during measurement, and then outputs to the secondary screen display control section a discrimination signal of each operating state while outputting a validity signal indicating whether input information when the first key is pushed in accordance with the respective operating states is valid or invalid,
    the selection item limit processing section outputs item limit information to the secondary screen display control section so as to limit the small item menus selectable on the secondary screen based on the discrimination signal from the operating state discriminating section,
    the display item discrimination processing section reads data of the large item menus and the small item menus from a storage section, discriminates a selection display object based on input information from the input section, and then outputs display information to the secondary screen display control section so that a relevant large item menu and a window of a corresponding relevant small item menu are displayed so as to be distinguished from other menus,
    the selection item discrimination and display processing section reads the data of the relevant large item menu and the relevant small item menu from the storage section, discriminates a selection item based on input information from the plurality of function keys, and outputs display processing information to the main screen display control section and the secondary screen display control section so that a screen having a function of the discriminated selection item is displayed on the main screen while a pop-up display on the secondary screen disappears,
    the main screen display control section controls display of the main screen based on the input information from the input section and display processing information from the selection item discrimination and display processing section, and
    the secondary screen display control section controls a display state of the secondary screen including identification and display of the relevant large item menu and the relevant small item menu based on the input information from the input section, the discrimination signal and validity signal from the operating state discriminating section, the item limit information from the selection item limit processing section, the display information from the display item discrimination processing section, and the display processing information from the selection item discrimination and display processing section.

20. A measurement data display method comprising:
  displaying fundamental measurement data of a measured object on a main screen of a display;
  popping up on the main screen a secondary screen which simultaneously includes a plurality of large item menus relating to additional measurement data of the measured object and a plurality of small item menus corresponding to each of the plurality of large item menus, responsive to an operation of a first key of an input section, wherein each of the plurality of small item menus is displayed at a position corresponding to each of a plurality of function keys of the input section;
  enabling one of the plurality of large item menus to be selected responsive to an operation of a second key of the input section; and
  enabling at least one of the plurality of small item menus corresponding to the selected one of the large item menus to be selected responsive to an operation of at least one of the plurality of function keys of the input section.

21. A measurement data display apparatus comprising:
  an input section provided on a front side of the measurement data display apparatus, and including at least a first key, a second key and a plurality of function keys;
  a display, also provided on the front side of the measurement data display apparatus, for displaying a main screen showing fundamental measurement data of the measured object; and
  a control section, responsive to an operation of the first key of the input section, for popping up on the main screen a secondary screen which includes a plurality of large item menus relating to additional measurement data of the measured object and a plurality of small item menus corresponding to each of the plurality of large item menus,
  wherein each of the plurality of small item menus are displayed at a position corresponding to each of the plurality of function keys of the input section,
  wherein the plurality of large item menus are enabled to be selected by operating the second key of the input section,
  wherein the control section comprises an operating state discriminating section, a selection item limit processing section, a display item discrimination processing section, a selection item discrimination and display processing section, a main screen display control section, and a secondary screen display control section, and wherein:

the operating state discriminating section discriminates operating states as to whether an optical fiber as the measured object is being measured, setting is made in the main screen, and the main screen opens a Setup screen during measurement, and then outputs to the secondary screen display control section a discrimination signal of each operating state while outputting a validity signal indicating whether input information when the first key is pushed in accordance with the respective operating states is valid or invalid, the selection item limit processing section outputs item limit information to the secondary screen display control section so as to limit the small item menus selectable on the secondary screen based on the discrimination signal from the operating state discriminating section, the display item discrimination processing section reads data of the large item menus and the small item menus from a storage section, discriminates a selection display object based on input information from the input section, and then outputs display information to the secondary screen display control section so that a relevant large screen menu and a window of a corresponding relevant small item menu are displayed so as to be distinguished from other menus, the selection item discrimination and display processing section reads the data of the relevant large item menu and the relevant small item menu from the storage section, discriminates a selection item based on input information from the plurality of function keys, and outputs display processing information to the main screen display control section and the secondary screen display control section so that a screen having a function of the discriminated selection item is displayed on the main screen while a pop-up display on the secondary screen disappears, the main screen display control section controls display of the main screen based on the input information from the input section and display processing information from the selection item discrimination and display processing section, and the secondary screen display control section controls a display state of the secondary screen including identification and display of the relevant large item menu and the relevant small item menu based on the input information from the input section, the discrimination signal and validity signal from the operating state discriminating section, the item limit information from the selection item limit processing section, the display information from the display item discrimination processing section, and the display processing information from the selection item discrimination and display processing section.

22. The measurement data display apparatus according to claim 21, wherein the control section identifies and displays the plurality of large item menus and the plurality of small item menus so that the control section distinguishes and displays a presently selected large item menu and a presently non-selected large item menu, and distinguishes and displays an executable small menu of the selected large item menu, and a non-executable small item menu.

23. The measurement data display apparatus according to claim 21, wherein in the case of displaying the plurality of small item menus, the control section displays the plurality of small item menus in plural lines so as to correspond to a number of the plurality of function keys when a number of the plurality of small item menus are more than the number of the plurality of function keys, and displays a switching menu for switching one of the small item menus of plural lines selectable by one of the plurality of function keys so that the switching menu is allocated to function keys other than the function key corresponding to the small item menu.

24. The measurement data display apparatus according to claim 21, wherein the large item menus include items relative to save, recall and print of waveform data, a comparison of waveform data and a continuous measurement, and an item relative to an input of an event comment and a land mark in a waveform display screen.

25. The measurement data display apparatus according to claim 24, wherein the plurality of large item menus comprise:

a "File" large item menu for carrying out the save, the recall and the print of waveform data;

an "Application" large item menu for carrying out the comparison of waveform data and the continuous measurement;

an "Event" large item menu for inputting the event comment and the land mark in the waveform display screen;

a "Configuration" large item menu for carrying out various settings; and a "Display" large item menu for carrying out a display setup.

26. The measurement data display apparatus according to claim 25, wherein the small item menu corresponding to the "File" large item menu comprises:

a "Save" small item menu for displaying a screen having a file save function;

a "Recall" small item menu for displaying a screen having a file recall function;

a "Print" small item menu for displaying a screen having a print function;

a "Continuous Print" small item menu for displaying a screen having a continuous print function; and a "File Utility" small item menu for displaying a screen having a file utility function.

27. The measurement data display apparatus according to claim 26, wherein when the "File" large item menu is identified and displayed as a selection item, a first F key is set to correspond to the "Save" small item menu, a second F key is set to correspond to the "Recall small item menu, a third F key is set to correspond to the "Print" small item menu, a fourth F key is set to correspond to the "Continuous Print" small item menu, and a fifth F key is set to correspond to the "File Utility" small item menu.

28. The measurement data display apparatus according to claim 25, wherein when the "Application" large item menu is identified and displayed as a selection item, two selection candidate items relative to the "Application" menu are displayed as a small item menu to be allocated to a first F key and a second F key of the plurality of function keys.

29. The measurement data display apparatus according to claim 28, wherein the small item menu corresponding to the "Application" large item menu comprises:

a "Repeat task" small item menu for displaying a screen having a continuous measurement function; and a "Wave compare" small item menu for displaying a screen having a waveform comparing function.

30. The measurement data display apparatus according to claim 29, wherein when the "Application" large item menu is identified and displayed as a selection item, the first F key of the plurality of function keys is set to correspond to the "Repeat task" small item menu, and the second F key is set to correspond to the "Wave Compare" small item menu.

31. The measurement data display apparatus according to claim 25, wherein when the "Event" large item menu is identified and displayed as a selection item, two selection candidate items relative to an even information input confirm menu are displayed as a small item menu to be allocated to a first F key and a second F key of the plurality of function keys.

32. The measurement data display apparatus according to claim 31, wherein in the small item menu of the "Event" large item menu, the first F key of the plurality of function keys is set to correspond to an "Event comment" small item menu for inputting the event comment, and the second F key is set to correspond to a "Land mark" small item menu for inputting the land mark.

33. The measurement data display apparatus according to claim 25, wherein when the "Configuration" large item menu is identified and displayed as a selection item, five selection candidate items relative to various setting are displayed as a small item menu to be allocated respectively to first to fifth F keys of the plurality of function keys.

34. The measurement data display apparatus according to claim 33, wherein a small item menu corresponding to the "Configuration" large item menu comprises:

a "System" small item menu for displaying a screen for setting equipments inclusive of time setting;

a "Printer" setting small item menu for displaying a screen for setting a printer type;

a "Serial port" small item menu for displaying a screen for setting a communication interface;

an "Optical switch" small item menu for displaying a screen for setting an optical switch; and a "Self test" small item menu for carrying out a self-diagnostic test.

35. The measurement data display apparatus according to claim 34, wherein when the "Configuration" large item menu is identified and displayed as a selection item, the first F key of the plurality of function keys is set to correspond to the "System" small item menu, the second F key is set to correspond to the "Printer setting" small item menu, the third F key is set to correspond to the "Serial port" small item menu, the fourth F key is set to correspond to the "Optical switch" small item menu, and the fifth F key is set to correspond to the "Self test" small item menu.

36. The measurement data display apparatus according to claim 25, wherein a small item menu corresponding to the "Display" large item menu comprises:

a "Horizontal offset" small item menu for displaying a screen for setting a horizontal axis offset;

a "Distance unit" small item menu for displaying a screen for setting a distance unit;

a "Vshift ON" small item menu for displaying an automatic vertical axis on/off screen;

an "Approxi image ON" small item menu for displaying an approximation straight line image on/off screen;

a "Reflective Item" small item menu for displaying a screen for setting a reflectivity measurement method; and a "Full view window" small item menu for displaying a screen for setting a display position of a Full View window.

37. The measurement data display apparatus according to claim 36, wherein when the "Display" large item menu is identified and displayed as a selection item, two lines of small item menus are displayed in a state of being arranged in right and left two plural lines on the secondary screen, and a right-hand side small item menu near to a side of the plurality of function keys by the fifth F key of the plurality of function keys is identified and displayed as a selection candidate item.

38. The measurement data display apparatus according to claim 21, wherein the plurality of function keys comprise:

a first F key having a function of displaying a Setup screen for setting a measurement condition when being pushed in a state that only the main screen is displayed;

a second F key having a function of displaying a lower hierarchy selection screen;

a third F key having a function of displaying a screen relative to a kind of measurements;

a fourth F key having a function of modifying setting of an approximation curve used in the case of carrying out a measurement; and a fifth F key having a function of displaying an arrangement setting screen of markers which is arranged on a waveform screen on the main screen and is used for determining a measuring point.

* * * * *